United States Patent
Lin

(10) Patent No.: US 12,277,964 B2
(45) Date of Patent: Apr. 15, 2025

(54) MEMORY DEVICE AND SENSE AMPLIFIER CAPABLE OF PERFORMING IN-MEMORY LOGICAL NOT OPERATION AND COMPUTING

(71) Applicant: Winbond Electronics Corp., Taichung (TW)

(72) Inventor: Shu-Sen Lin, Hsinchu County (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 183 days.

(21) Appl. No.: 18/178,915

(22) Filed: Mar. 6, 2023

(65) Prior Publication Data
US 2024/0304236 A1    Sep. 12, 2024

(51) Int. Cl.
| | |
|---|---|
| G11C 7/06 | (2006.01) |
| G11C 11/4091 | (2006.01) |
| G11C 11/4094 | (2006.01) |
| G11C 11/4096 | (2006.01) |

(52) U.S. Cl.
CPC ...... *G11C 11/4091* (2013.01); *G11C 11/4094* (2013.01); *G11C 11/4096* (2013.01)

(58) Field of Classification Search
CPC ............ G11C 11/4091; G11C 11/4094; G11C 11/4096
See application file for complete search history.

(56) References Cited

U.S. PATENT DOCUMENTS

| | | | |
|---|---|---|---|
| 6,262,920 B1 * | 7/2001 | Louie ................ | G11C 16/10 365/185.25 |
| 6,504,776 B1 | 1/2003 | Nakaoka | |
| 9,786,348 B1 * | 10/2017 | Kawamura ......... | G11C 11/2273 |
| 9,886,991 B1 * | 2/2018 | Vimercati ............ | G11C 7/1051 |
| 10,872,644 B2 | 12/2020 | Fujiwara et al. | |
| 2002/0186598 A1 | 12/2002 | Ooishi | |
| 2016/0064045 A1 * | 3/2016 | La Fratta ............. | G11C 7/1051 365/189.011 |
| 2018/0350421 A1 * | 12/2018 | Kawamura ........... | G11C 11/221 |
| 2021/0005243 A1 * | 1/2021 | Bae ...................... | G11C 11/4091 |
| 2024/0304232 A1 * | 9/2024 | Lin ...................... | G11C 11/4096 |

* cited by examiner

*Primary Examiner* — Mushfique Siddique
(74) *Attorney, Agent, or Firm* — Birch, Stewart, Kolasch & Birch, LLP

(57) ABSTRACT

A sense amplifier capable of performing a logical NOT operation is provided, which includes a sense circuit, configured to sense a first voltage of a bit line and a second voltage of an inverse bit line; a first transistor, coupled between a first terminal of the sense circuit and the bit line; a second transistor, coupled between a second terminal of the sense circuit and the inverse bit line; and a third transistor, coupled between the bit line and the inverse bit line. First and second memory cells are respectively controlled by first and second word lines, and connected to the bit line. When the sense amplifier is in an inverse writing state, the sense amplifier writes the second voltage to the second memory cell through a predetermined path. A first logical state of the first voltage is complementary to a second logical state of the second voltage.

13 Claims, 5 Drawing Sheets

MEMORY DEVICE AND SENSE AMPLIFIER CAPABLE OF PERFORMING IN-MEMORY LOGICAL NOT OPERATION AND COMPUTING

BACKGROUND OF THE INVENTION

Field of the Invention

The present invention relates to a memory device, and, in particular, to a memory device and a sense amplifier capable of performing a logical NOT operation.

Description of the Related Art

Generally, conventional computer devices use Von Neumann architecture for data transmission between a central processing unit and a memory device. However, when the demand for data transmission between the central processing unit and the memory device is extremely high, a data transmission bottleneck often occurs between the central processing unit and the memory device. This is called a von Neumann bottleneck. Therefore, a memory device and a sense amplifier capable of performing in-memory computing are required to solve the issues described above.

BRIEF SUMMARY OF THE INVENTION

An embodiment of the present invention provides a sense amplifier capable of performing a logical NOT operation. The sense amplifier comprises a sense circuit, a first transistor, a second transistor, and a third transistor. The sense circuit is configured to sense a first voltage of a bit line and a second voltage of an inverse bit line complementary to the bit line. The first transistor is coupled between a first terminal of the sense circuit and the bit line, the second transistor is coupled between a second terminal of the sense circuit and the inverse bit line, and the third transistor is coupled between the bit line and the inverse bit line. A first memory cell and a second memory cell are respectively controlled by a first word line and a second word line, wherein the first memory cell and the second memory cell are connected to the bit line. When the sense amplifier is in an inverse writing state, the sense amplifier writes the second voltage to the second memory cell through a predetermined path, wherein a first logical state of the first voltage is complementary to a second logical state of the second voltage.

An embodiment of the present invention provides a memory device capable of performing a logical NOT operation. The memory device comprises a memory cell array and a sense amplifier. The memory cell array comprises memory cells arranged in a two-dimensional array, wherein the memory cells on each row of the memory cell array are connected to corresponding word lines, and the memory cells on each column of the memory cell array are connected to corresponding bit lines. The sense amplifier comprises a sense circuit, a first transistor, a second transistor, and a third transistor. The sense circuit is configured to sense a first voltage of a bit line and a second voltage of an inverse bit line. The inverse bit line is complementary to the bit line. The first transistor is coupled between a first terminal of the sense circuit and the bit line. The second transistor is coupled between a second terminal of the sense circuit and the inverse bit line. The third transistor is coupled between the bit line and the inverse bit line. A first memory cell and a second memory cell are respectively controlled by a first word line and a second word line. The first memory cell and the second memory cell are connected to the bit line. When the sense amplifier is in an inverse writing state, the sense amplifier writes the second voltage to the second memory cell through a predetermined path, wherein a first logical state of the first voltage is complementary to a second logical state of the second voltage.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
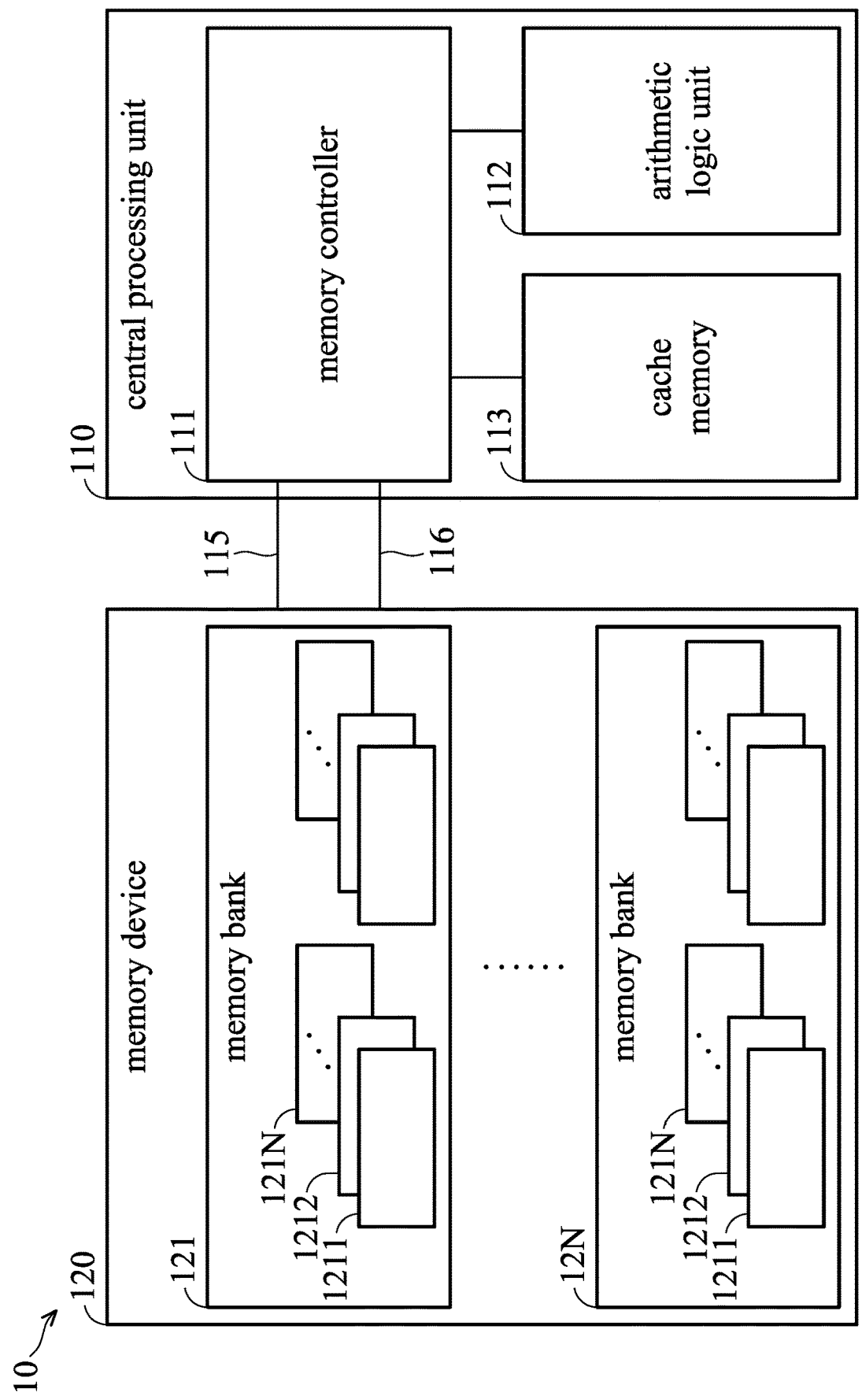
FIG. 1 shows a schematic diagram of an operating device, in accordance with an embodiment of the present invention.

FIG. 1 shows a schematic diagram of an operating device, in accordance with an embodiment of the present invention. As shown in FIG. 1, the computing device 10 includes a central processing unit 110 and a memory device 120. The central processing unit 110 is electrically connected to the memory device 120, wherein the memory device 120 includes, for example, one or more dynamic random access memory (DRAM) chips, but the present invention is not limited thereto. The memory device 120 includes, for example, a plurality of memory banks, and each memory bank includes a plurality of memory cell arrays, wherein each memory cell array is, for example, arranged in a two-dimensional array (e.g., M rows*N columns), and wherein each row and each column of the memory cell arrays are respectively connected to the corresponding word line and bit line. In addition, each memory cell may store 1-bit or M-bit data, where M is an integer greater than 1.

The central processing unit 110 includes, for example, a memory controller 111, an arithmetic logic unit (ALU) 112, and a cache memory 113. The memory controller 111 is used to control data access of the memory device 120. It should be noted that, a control signal 115 sent from the memory controller 111 to the memory device 120 may control the memory device 120 to perform in-memory computing, such as performing a bitwise NOT operation. The memory controller 111 may further receive the data has processed by bitwise operations or the general data not processed by logic operations from the memory device 120.

The arithmetic logic unit 112 performs corresponding arithmetic operations and/or logic operations according to instructions executed by the central processing unit 110. In some embodiments, in order to reduce the data bandwidth requirement between the central processing unit 110 and the memory device 120, the memory controller 111 of the central processing unit 110 will send the corresponding control signal 115 to the memory device 120 to hand over part of the logic operations (e.g., bitwise NOT operation) to the memory device 120 for execution, and receive the data has processed by the logic operation from the memory device 120 (e.g., through the data bus 116), and then send the data to the arithmetic logic unit 112 for subsequent processing.

The memory device 120 includes, for example, a plurality of memory banks 121-12N, and each of the memory banks 121-121N includes a plurality of memory cell arrays 1211-121N.

Figure 2:
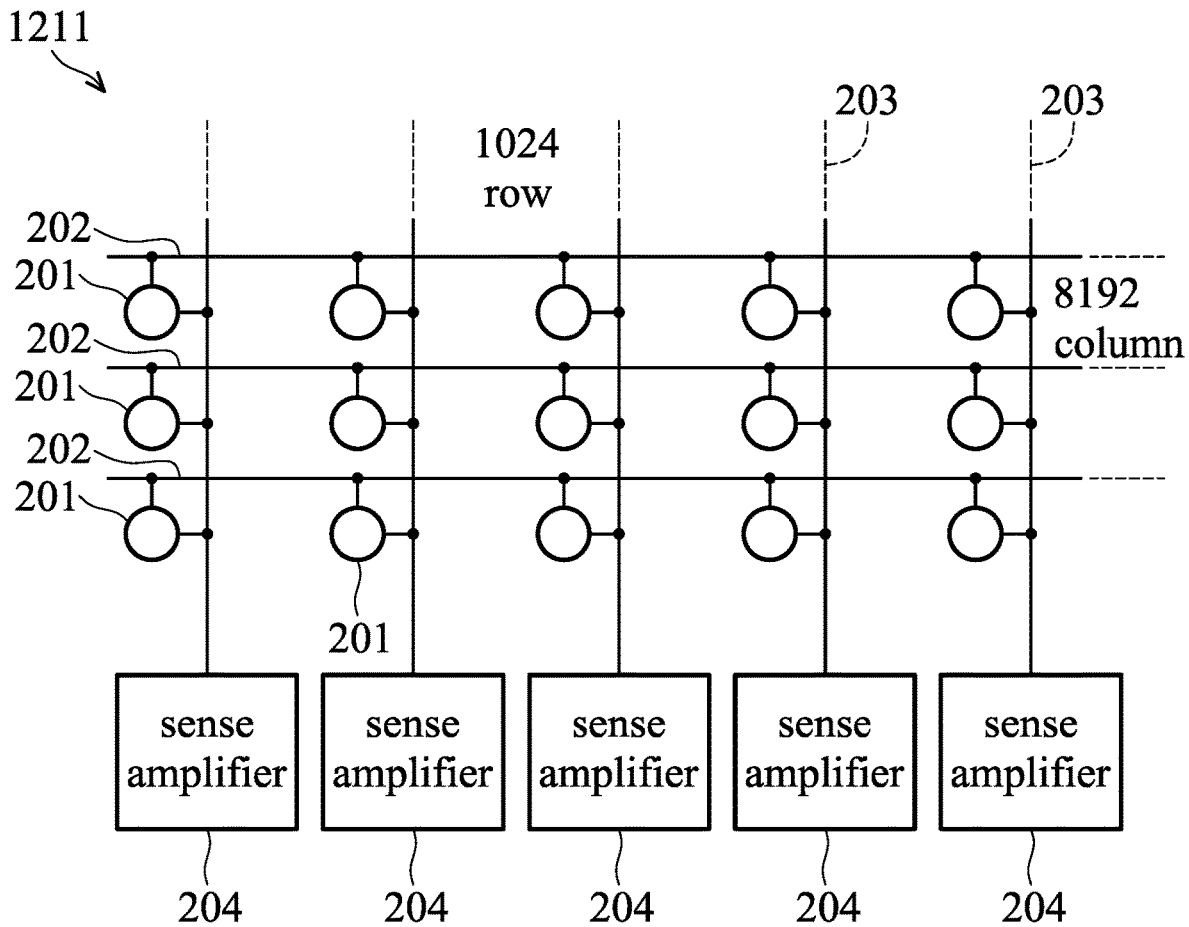
FIG. 2 shows a circuit diagram of a memory cell array, in accordance with the embodiment in FIG. 1 of the present invention.

FIG. 2 shows a circuit diagram of a memory cell array, in accordance with the embodiment in FIG. 1 of the present invention. Please refer to FIG. 1 and FIG. 2 at the same time.

In FIG. 2, the illustration is performed with the memory cell array 1211, and the circuit diagram of other memory cell array 1212~121N are similar to those in FIG. 2. The memory cell array 1211 includes a plurality of memory cells 201. The memory cells 201 are arranged in a two-dimensional array, the memory cells 201 of each row are connected to the corresponding word line 202, and the memory cells 201 of each column are connected to the corresponding bit line 203. In addition, each bit line 203 is connected to the corresponding sense amplifier 204.

Figure 3A:
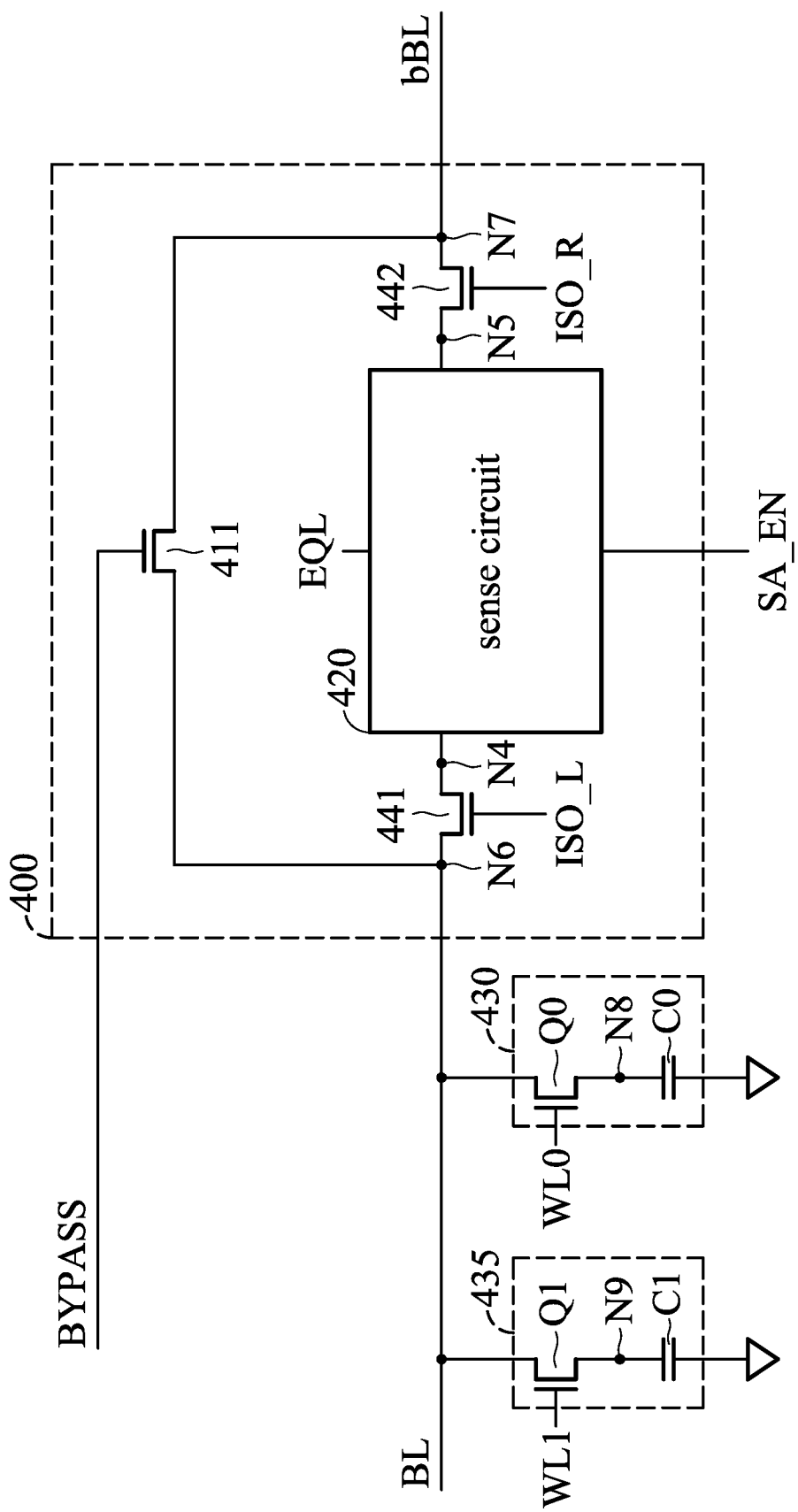
FIG. 3A shows a block diagram of a sense amplifier, in accordance with the embodiment in FIG. 2 of the present invention.
Figure 3B:
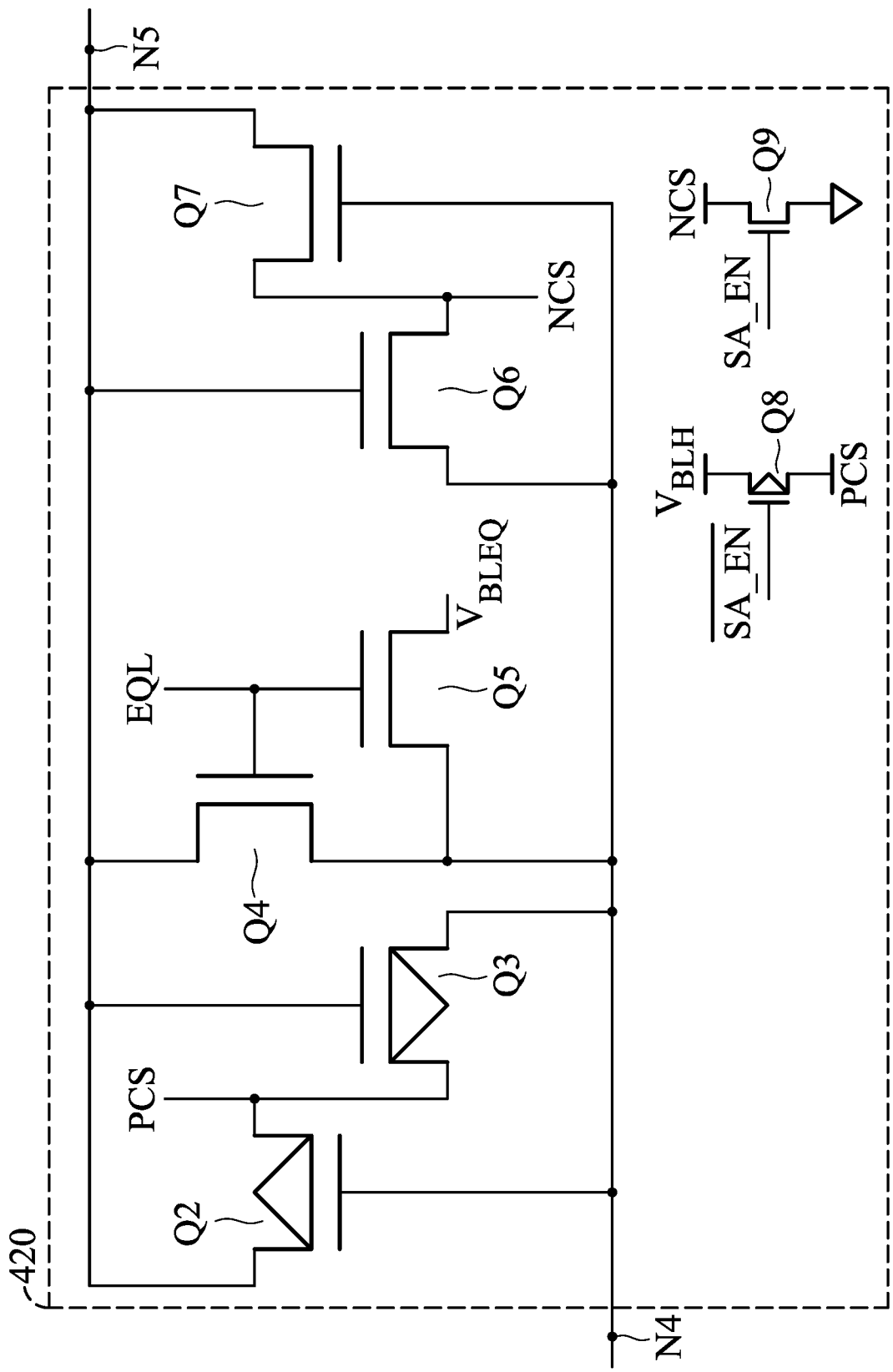
FIG. 3B shows a circuit diagram of a sense circuit, in accordance with the embodiment in FIG. 3A of the present invention.

FIG. 3A shows a block diagram of a sense amplifier, in accordance with the embodiment in FIG. 2 of the present invention. FIG. 3B shows a circuit diagram of a sense circuit, in accordance with the embodiment in FIG. 3A of the present invention. Please refer to FIG. 2 and FIGS. 3A-3B at the same time.

The sense amplifier 204 in FIG. 2 can be implemented by the sense amplifier 400 in FIG. 3A. As shown in FIG. 3A, the sense amplifier 400 includes transistors 411, 441, and 442, and a sense circuit 420. A control terminal of the transistor 411 is connected to the bypass signal BYPASS, and a first terminal and a second terminal of the transistor 411 are respectively connected to an inverse bit line bBL (e.g., node N7) and a bit line BL (e.g., node N6).

Control terminals of the transistors 441 and 442 are respectively connected to isolation signals ISO_L and ISO_R. A first terminal of the transistor 441 (e.g., node N4) is connected to the sense circuit 420, and a second terminal of the transistor 441 (e.g., node N6) is connected to the bit line BL. A first terminal of the transistor 442 (e.g., node N7) is connected to the inverse bit line bBL, and a second terminal of the transistor 442 (e.g., node N5) is connected to the sense circuit 420. A transistor Q0 in a memory cell 430 is controlled by a word line WL0, and the transistor Q0 is also connected to the bit line BL (e.g., node N6). A transistor Q1 in a memory cell 435 is controlled by a word line WL1, and the transistor Q1 is also connected to the bit line BL (e.g., node N6).

Please refer to FIG. 3B, the sense circuit 420 may include transistors Q2~Q9, for example, wherein the transistors Q4 and Q5 form a balance circuit. For example, when the balance signal EQL is in a high logic state, the transistors Q4 and Q5 are both turned on, so the voltages at nodes N4 and N5 are balanced through the transistor Q4, wherein at nodes N4 and N5, for example, a bit line balance voltage $V_{BLEQ}$ can be obtained through the transistor Q5. Transistors Q2~Q3 and Q6~Q7 form an inverter loop. In detail, an inverter composed of the transistors Q2 and Q7 has an input terminal coupled to node N4 and an output terminal coupled to node N5. Another inverter composed of transistors Q3 and Q6 has an input terminal coupled to node N5 and an output terminal coupled to node N4. Therefore, these two inverters form an inverter loop circuit. Transistors Q8 and Q9 are respectively used to generate control signals PCS and NCS.

For example, when the sensing enable signal SA_EN is in a low logic state, neither the control signal PCS nor the control signal NCS changes. At this time, the sensing circuit 420 is in a turned-off state. When the sensing enable signal SA_EN is in the high logic state, the control signal PCS is in the high logic state, and the control signal NCS is in a ground state. At this time, the sensing circuit 420 can operate normally.

Please refer to FIG. 3A again. In an embodiment, when it is desired to use the sense amplifier 400 to sense a data voltage stored in a capacitor C1 of the memory cell 435, it is still necessary to perform a pre-charge state, an activated state, and a sensing state in sequence. In the pre-charge state, the word line WL1 and the sensing enable signal SA_EN are in the low logic state, and the isolation signals ISO_L and ISO_R, the bypass signal BYPASS, and the balance signal EQL are all in the high logic state. At this time, the voltage level of the bit line BL will be pre-charged to a voltage of $\frac{1}{2}V_{DD}$.

In the activated state, the word line WL1 is switched to the high logic state, the isolation signals ISO_L and ISO_R are also in the high logic state, and the sensing enable signal SA_EN, the bypass signal BYPASS, and the balance signal EQL are all in the low logic state. At this time, the data voltage stored in the capacitor C1 of the memory cell 435 will be transmitted to the bit line BL to change the voltage level of the bit line BL.

In the sensing state, the word line WL1 is maintained in the high logic state, and the isolation signals ISO_L and ISO_R are also in the high logic state. Both the bypass signal BYPASS and the balance signal EQL are in the low logic state, but the sensing enable signal SA_EN will be switched to the high logic state to enable the sense circuit 420 to sense the voltage level on the bit line BL.

Figure 4:
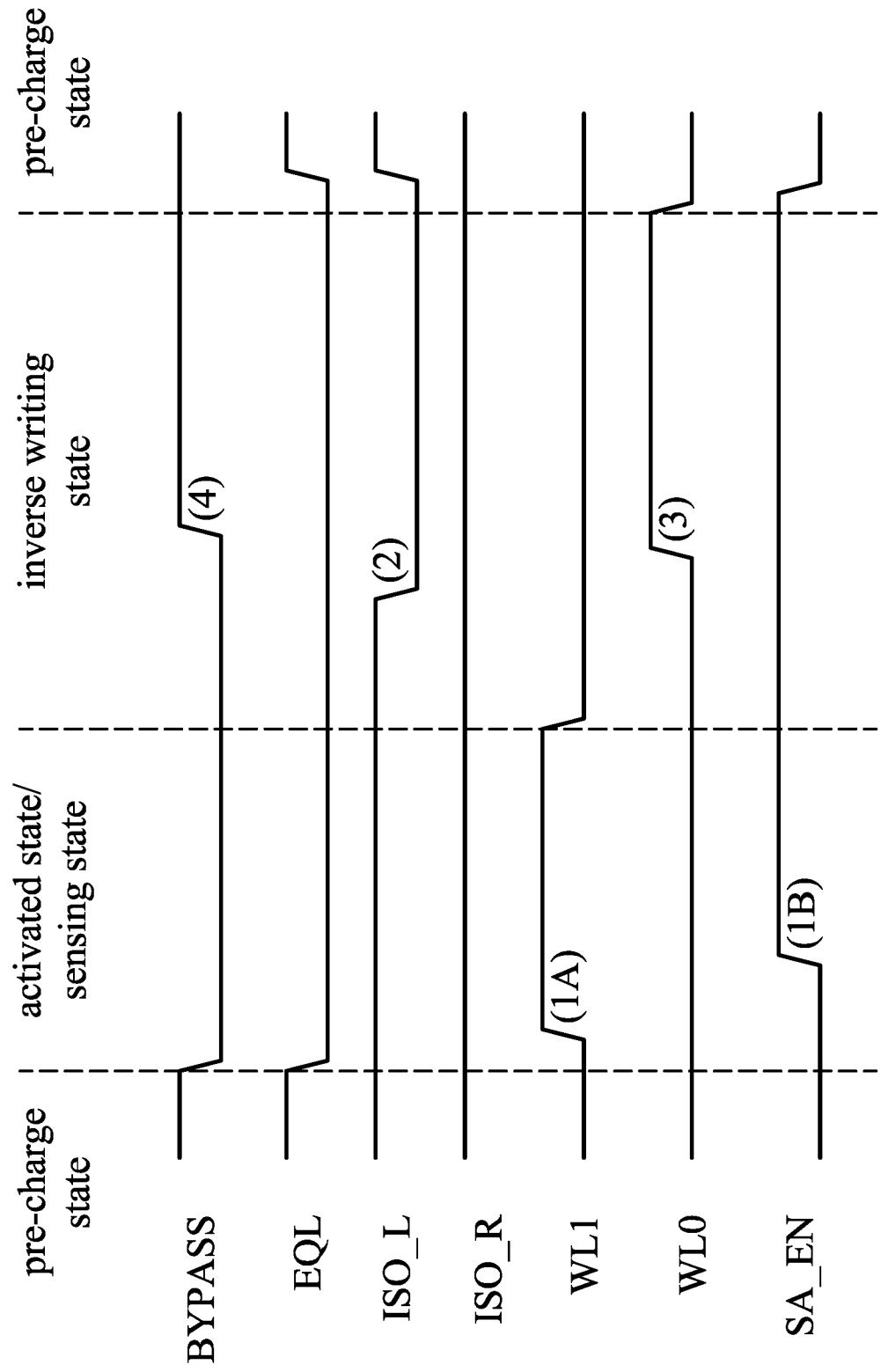
FIG. 4 shows a waveform of a logical NOT operation performed by the sense amplifier, in accordance with the embodiment in FIG. 3A of the present invention.

FIG. 4 shows a waveform of a logical NOT operation performed by the sense amplifier, in accordance with the embodiment in FIG. 3A of the present invention. Please refer to FIG. 3A and FIG. 4 at the same time.

The sense amplifier 400 MAY further be used to perform a NOT logic operation. For example, when the sense amplifier 400 desires to perform a NOT logic operation on the data voltage stored in the capacitor C1 of the memory cell 435, the sense amplifier 400 will still first enter the pre-charge state to pre-charge the bit line BL to a predetermined voltage level, such as the voltage of $\frac{1}{2}V_{DD}$. At this time, the isolation signals ISO_L and ISO_R, the bypass signal BYPASS, and the balance signal EQL are all in the high logic state, and the sensing enable signal SA_EN, word line WL0, and word line WL1 are all in the low logic state.

Then, the sense amplifier 400 will perform the following operations in sequence:

Operation (1A): The sense amplifier 400 enters the activated state to enable the word line WL1, and then enables the sensing enable signal SA_EN in operation (1B). For example, a word line decoder (not shown) in the memory cell array 1211 enables the word line WL1 (e.g., to the high logic state) according to an address signal in the control signal 115. At this time, the data voltage stored in the capacitor C1 is latched in the sense circuit 420. It should be noted that, at this time, the isolation signals ISO_L and ISO_R are also in the high logic state, and the bypass signal BYPASS and the balance signal EQL are both in the low logic state. The sensing enable signal SA_EN is switched from the low logic state to the high logic state.

Operation (2): switch the isolation signal ISO_L to the low logic state, and maintain the isolation signal ISO_R in the high logic state.

Operation (3): switch the word line WL0 to the high logic state.

Operation (4): switch the bypass signal BYPASS to the high logic state.

Therefore, after operations (1)~(4), the sense amplifier 400 enters an inverse writing state to transmit the voltage level on the inverse bit line bBL to the node N8 through the transistor 442 and transistor 411 in sequence. Accordingly, the last data voltage stored in the capacitor C0 of the memory cell 430 is the voltage level on the inverse bit line bBL, that is, the inverse (NOT) value of the logic level of the data voltage stored in the capacitor C1 of the memory cell 435. In some embodiments, the order of operations (3) and (4) can be reversed.

For example, when the data voltage stored in the capacitor C1 of the memory cell 435 is in the high logic state, the voltage level on the bit line BL sensed by the sense circuit 420 is also in the high logic state. At this time, the voltage level on the inverse bit line bBL is in the low logic state. Therefore, after operations (1)~(4), the voltage level on the inverse bit line bBL is transmitted to the node N8 through the transistor 442 and the transistor 411 in sequence. Accordingly, the last data voltage stored in the capacitor C0 of the memory cell 430 is in the low logic state. In contrast, when the data voltage stored in the capacitor C1 of the memory cell 435 is in the low logic state, the voltage level on the bit line BL sensed by the sense circuit 420 is also in the low logic state. At this time, the voltage level on the inverse bit line bBL is in the high logic state. Therefore, after operations (1)~(4), the voltage level on the inverse bit line bBL is transmitted to the node N8 through the transistor 442 and the transistor 411 in sequence. Accordingly, the last data voltage stored in the capacitor C0 of the memory cell 430 is in the high logic state.

In some embodiments, the word lines WL1 and WL0 may be adjacent word lines or non-adjacent word lines.

Please refer to FIGS. 1, 2, and 3A again. In an embodiment, between each two memory cell arrays (e.g., between memory cell arrays 1211 and 1212, between memory cell arrays 1212 and 1213, and so on), a sense amplifier 400 is disposed. In other words, on the right side of the sense amplifier 400 in FIG. 3A, there is a word line (e.g., word line WL2) connected by the memory cells of another memory cell array. Therefore, when it is desired to perform logical NOT operation on the logic level of the data voltage stored in the capacitor C0 in the memory cell 430, the memory cell in the memory cell array on the right side of the sense amplifier 400 can be utilized to store the inverse value. In this embodiment, the details of operations (1)~(4) are slightly different. For example, the operation (2) can be changed to operation (2A) to switch the isolation signal ISO_L to the high logic state and maintain the isolation signal ISO_R in the low logic state. Therefore, the voltage level on the bit line BL will pass through the transistor 411 to write into the capacitance of the memory cell in the memory cell array on the right side of the sense amplifier 400 to achieve the logical NOT operation.

In summary, the present invention provides a sense amplifier capable of performing a logical NOT operation. The sense amplifier may be disposed in a plurality of memory cell array of the memory device, and used to perform the logical NOT operation on the logic level of the data voltage stored in the memory cell according to the control signal from the memory controller.

What is claimed is:

1. A sense amplifier capable of performing a logical NOT operation, comprising:
a sense circuit, configured to sense a first voltage of a bit line and a second voltage of an inverse bit line complementary to the bit line;
a first transistor, coupled between a first terminal of the sense circuit and the bit line;
a second transistor, coupled between a second terminal of the sense circuit and the inverse bit line; and
a third transistor, coupled between the bit line and the inverse bit line;
wherein a first memory cell and a second memory cell are respectively controlled by a first word line and a second word line, and wherein the first memory cell and the second memory cell are connected to the bit line;
wherein when the sense amplifier is in an inverse writing state, the sense amplifier writes the second voltage to the second memory cell through a predetermined path, and wherein a first logical state of the first voltage is complementary to a second logical state of the second voltage.

2. The sense amplifier capable of performing the logical NOT operation as claimed in claim 1, wherein a control terminal of the first transistor is connected to a first isolation signal, a control terminal of the second transistor is connected to a second isolation signal, and a control terminal of the third transistor is connected to a bypass signal.

3. The sense amplifier capable of performing the logical NOT operation as claimed in claim 2, wherein when the sense amplifier is in a pre-charge state, the first isolation signal, the second isolation signal, and the bypass signal are in a high logic state, and a balance signal and a sensing enable signal of the sense circuit are respectively in the high logic state and a low logic state.

4. The sense amplifier capable of performing the logical NOT operation as claimed in claim 3, wherein when the sense amplifier enters an activated state, the bypass signal and the balance signal are switched to the low logic state, the sensing enable signal is in the low logic state, and the first word line is switched to the high logic state, so as to latch a first data voltage in the sense circuit, wherein the first data voltage is stored in the first memory cell.

5. The sense amplifier capable of performing the logical NOT operation as claimed in claim 4, wherein when the sense amplifier enters a sensing state, the first word line is maintained in the high logic state, both the bypass signal and the balance signal are in the low logic state, and the sensing enable signal is switched to the high logic state.

6. The sense amplifier capable of performing the logical NOT operation as claimed in claim 5, wherein when the sense amplifier enters the inverse writing state, the first isolation signal is switched to the low logic state to turn off the first transistor, the bypass signal is switched to the high logic state to turn on the third transistor, and the second word line is switched to the high logic state to turn on the second memory cell.

7. The sense amplifier capable of performing the logical NOT operation as claimed in claim 6, wherein in the inverse writing state, the second voltage on the inverse bit line is written to the second memory cell through the third transistor, so that a second data voltage stored in the second memory cell is equal to the second voltage.

8. The sense amplifier capable of performing the logical NOT operation as claimed in claim 7, wherein the sense circuit comprises a first inverter and a second inverter, wherein an input terminal of the first inverter is connected to the second terminal of the sense circuit, and an output terminal of the first inverter is connected to the first terminal of the sense circuit;
  wherein an input terminal of the second inverter is connected to the first terminal of the sense circuit, and an output terminal of the second inverter is connected to the second terminal of the sense circuit.

9. The sense amplifier capable of performing the logical NOT operation as claimed in claim 1, wherein the sense amplifier writes the second voltage to the second memory cell through the second transistor and the third transistor in sequence.

10. A memory device capable of performing a logical NOT operation, comprising:
  a memory cell array, comprising memory cells arranged in a two-dimensional array, wherein the memory cells on each row of the memory cell array are connected to corresponding word lines, and the memory cells on each column of the memory cell array are connected to corresponding bit lines; and
  a sense amplifier, comprising:
    a sense circuit, configured to sense a first voltage of a bit line and a second voltage of an inverse bit line complementary to the bit line;
    a first transistor, coupled between a first terminal of the sense circuit and the bit line;
    a second transistor, coupled between a second terminal of the sense circuit and the inverse bit line; and
    a third transistor, coupled between the bit line and the inverse bit line;
  wherein a first memory cell and a second memory cell are respectively controlled by a first word line and a second word line, and wherein the first memory cell and the second memory cell are connected to the bit line;
  wherein when the sense amplifier is in an inverse writing state, the sense amplifier writes the second voltage to the second memory cell through a predetermined path, and wherein a first logical state of the first voltage is complementary to a second logical state of the second voltage.

11. The memory device capable of performing the logical NOT operation as claimed in claim 10, wherein in the inverse writing state, the second voltage on the inverse bit line is written to the second memory cell through the third transistor, so that a second data voltage stored in the second memory cell is equal to the second voltage.

12. The memory device capable of performing the logical NOT operation as claimed in claim 11, wherein the sense circuit comprises a first inverter and a second inverter, wherein an input terminal of the first inverter is connected to the second terminal of the sense circuit, and an output terminal of the first inverter is connected to the first terminal of the sense circuit;
  wherein an input terminal of the second inverter is connected to the first terminal of the sense circuit, and an output terminal of the second inverter is connected to the second terminal of the sense circuit.

13. The memory device capable of performing the logical NOT operation as claimed in claim 10, wherein the sense amplifier writes the second voltage to the second memory cell through the second transistor and the third transistor in sequence.

* * * * *